United States Patent
Kitagawa

[11] Patent Number: 5,821,612
[45] Date of Patent: Oct. 13, 1998

[54] HEAT RADIATIVE ELECTRONIC COMPONENT

[75] Inventor: Hiroji Kitagawa, Nagoya, Japan

[73] Assignee: Kitigawa Industries Co., Ltd., Nagoya, Japan

[21] Appl. No.: 666,892

[22] Filed: Jun. 18, 1996

[30] Foreign Application Priority Data

Aug. 21, 1995 [JP] Japan .................................. 7-211813

[51] Int. Cl.$^6$ .................................................. H01L 23/34
[52] U.S. Cl. .......................... 257/675; 257/706; 257/717; 257/796; 361/705; 361/718; 361/723
[58] Field of Search .................................. 257/675, 706, 257/717, 720, 796; 361/705, 717, 718, 723

[56] References Cited

U.S. PATENT DOCUMENTS

| | | | |
|---|---|---|---|
| 4,352,120 | 9/1982 | Kurihara et al. | 257/717 |
| 4,901,137 | 2/1990 | Sato et al. | 257/717 |
| 5,379,186 | 1/1995 | Gold et al. | 361/706 |
| 5,422,788 | 6/1995 | Heinen et al. | 257/796 |
| 5,430,331 | 7/1995 | Hamsehdoost et al. | 257/796 |
| 5,581,121 | 12/1996 | Burn et al. | 257/706 |

FOREIGN PATENT DOCUMENTS

| | | |
|---|---|---|
| 0 484 180 A1 | 5/1992 | European Pat. Off. . |
| 0 539 095 A2 | 4/1993 | European Pat. Off. . |
| 0 594 395 A2 | 4/1994 | European Pat. Off. . |
| 7161884 | 6/1995 | Japan . |
| 7190675 | 7/1995 | Japan . |
| 7261694 | 10/1995 | Japan . |

OTHER PUBLICATIONS

Muramatsu, Shigeji, "Manufacture of Semiconductor Device", Mar. 1, 1988, Abstract, No. JP 63–048850 (A).

Yokono, Ataru, "Parts for Heat Dissipation Use", Apr. 25, 1990, Abstract, No. JP 02–113561 (A).

*Primary Examiner*—David Ostrowski
*Attorney, Agent, or Firm*—Davis and Bujold

[57] ABSTRACT

An electronic component provided with a heat radiative ceramic plate that is protected from cracks. Such a heat radiative electronic component is composed of an electronic device, such as a semiconductor device with an integrated circuit built therein, having a heat radiative plate bonded on its upper surface. The heat radiative plate is formed by a ceramic plate coated with a resin layer. The ceramic plate is a 1 mm to 2 mm thick quadrangular plate prepared by sintering cordierite powder, which has a high emissivity of far-infrared rays. The resin layer entirely or partly covers the surface of the ceramic plate, thereby preventing the plate from breaking and/or chipping and scattering ceramic powder to the surrounding area.

15 Claims, 6 Drawing Sheets

HEAT RADIATIVE ELECTRONIC COMPONENT

FIELD OF THE INVENTION

This invention relates to an electronic device with a heat radiative ceramic plate attached thereto.

BACKGROUND OF THE INVENTION

Integrated circuit chips for use in central processing units or other electronic equipment have recently been increasingly integrated and operated at increasingly higher rates. This increases power consumption and heat output, and heat radiation has become an issue.

In Japanese laid-open patent application Nos. 7-161884 and 7-190675, and Japanese patent application No. 7-261694, the applicant of the present application proposed a radiative material composed of far-infrared ray radiative substances. The radiative material converts heat energy of the electronic component into far-infrared rays, and efficiently radiates heat.

Conventionally, a heat radiative plate, formed of infrared ray radiative ceramic, is secured to the electronic component for use. However, since ceramic is a rather brittle material, the ceramic plate is easily broken during use. If the ceramic plate is broken, ceramic powder is dispersed over the circuits of nearby substrates bearing electronic components, thereby causing a malfunction of the circuit.

SUMMARY OF THE INVENTION

Wherefore, an object of the present invention is to provide an electronic component having a heat radiative ceramic plate which is protected from cracking.

To attain this or other objects, the invention provides an electronic component with a far-infrared ray radiative ceramic plate secured thereto. The surface of the ceramic plate is entirely or partly covered with resin.

In the aforementioned structure according to the invention, the ceramic plate is coated and reinforced with resin and is thereby protected from cracking. Therefore, no ceramic powder is dispersed during use, and no malfunction of the circuit of nearby substrate bearing electronic components arises. Instead of coating the entire surface of the ceramic plate, only edges or other fragile portions of the ceramic plate can be covered with resin, with almost the same effectiveness being obtained. The ceramic plate according to the invention converts heat generated by electronic components into far-infrared rays, and radiates the rays to the surrounding area. Even if the entire surface of the ceramic plate is covered with resin, heat radiation of the plate is not impaired, because far-infrared rays are a kind of electromagnetic wave that can be transmitted through resin in a range of most of its wavelengths.

The ceramic plate according to the invention is preferably superior in far-infrared ray radiation and has a high emissivity. The emissivity herein referred to is a ratio of the radiant quality of the corresponding substance to the radiant quality of a black body under the same conditions. An emissivity closer to 1(one) indicates a better conversion efficiency from heat energy to electromagnetic waves.

The material of the ceramic plate is preferably, for example, cordierite ($2MgO \cdot 2Al_2O_3 \cdot 5SiO_2$), β-spodumene ($LiO_2 \cdot Al_2O_3 \cdot 4SiO_2$), aluminum titanate ($Al_2O_3 \cdot Ti_2O_3$) or other ceramic material having a high far-infrared radiation, a low thermal expansion and a low heat resistance. Furthermore, for the ceramic material having a high emissivity in the entire infrared region, a transition element oxide ceramic (e.g. ceramic composed of 60% by weight of $MnO_2$, 20% by weight of $Fe_2O_3$, 10% by weight of CuO and 10% by weight of CoO) can be used. Additionally, so called "Bakuhanseki" (the natural stone produced in China) can also be used.

As aforementioned, a ceramic superior in far-infrared ray radiation is preferable. Specifically, an infra-red radiative ceramic having a sufficient emissivity in a range of ordinary operating temperatures, i.e. lower than about 100° C., is preferable. The ceramic can provide a sufficient heat radiation in a range of temperatures lower than 110° C., around which temperature an integrated circuit chip tends to overheat. For such an infra-red radiative ceramic, a ceramic that radiates far-infrared rays virtually at a black-body level, for example, at an emissivity of at least 80% is especially preferable.

BRIEF DESCRIPTION OF THE DRAWINGS

The invention will now be described, by way of example, with reference to the accompanying drawings, in which.

DETAILED DESCRIPTION OF THE PREFERRED EMBODIMENTS

Figure 1:
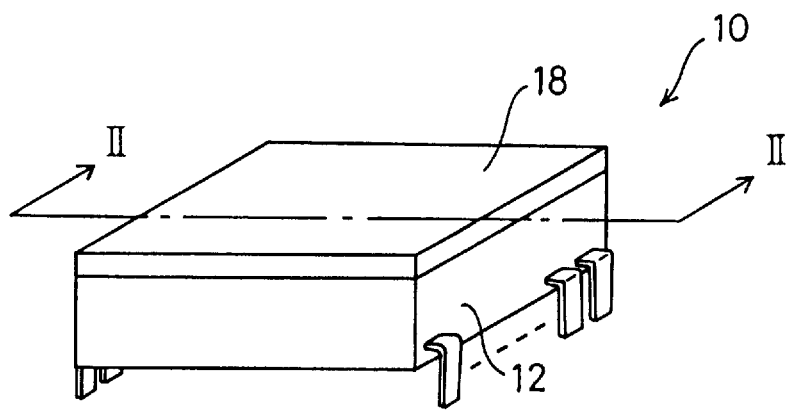
FIG. 1 is a perspective view and FIG. 2 is a cross-sectional view along line II—II in FIG. 1, showing a heat radiative electronic component of a first embodiment of the invention.
Figure 2:
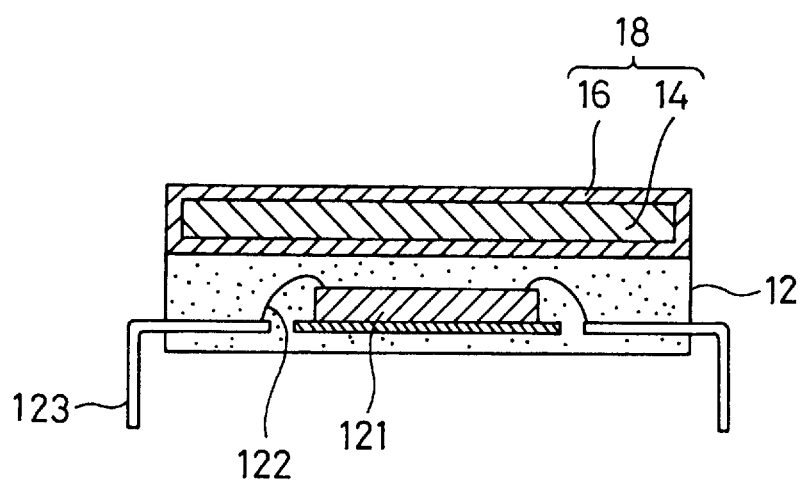

According to the first embodiment of the invention, as shown in FIG. 1, a heat radiative electronic component 10 is provided with a heat radiative plate 18 secured onto an upper face of a semiconductor device 12 with an integrated circuit built therein. As shown in FIG. 2, the heat radiative plate 18 is composed of a ceramic plate 14 surrounded by a resin layer 16. The semiconductor device 12 contains an IC chip 121, bonding wire 122 and electrical leads 123.

To obtain the ceramic plate 14, cordierite powder, having a high emissivity of far-infrared rays, is sintered and is formed in the shape of a quadrangular plate with a thickness of 1 mm to 2 mm. The entire surface of the ceramic plate 14 is then coated with the resin layer 16, such that the ceramic plate 14 is prevented from cracking and/or chipping.

A highly heat conductive material is preferably used to form the resin layer 16, such that heat from the semiconductor device 12 is efficiently transmitted to the ceramic plate 14. The resin layer 16 is preferably as thin as possible. However, the resin layer 16 requires a thickness of at least 20 μm, because too thin a layer would be easily torn off.

Figure 10:
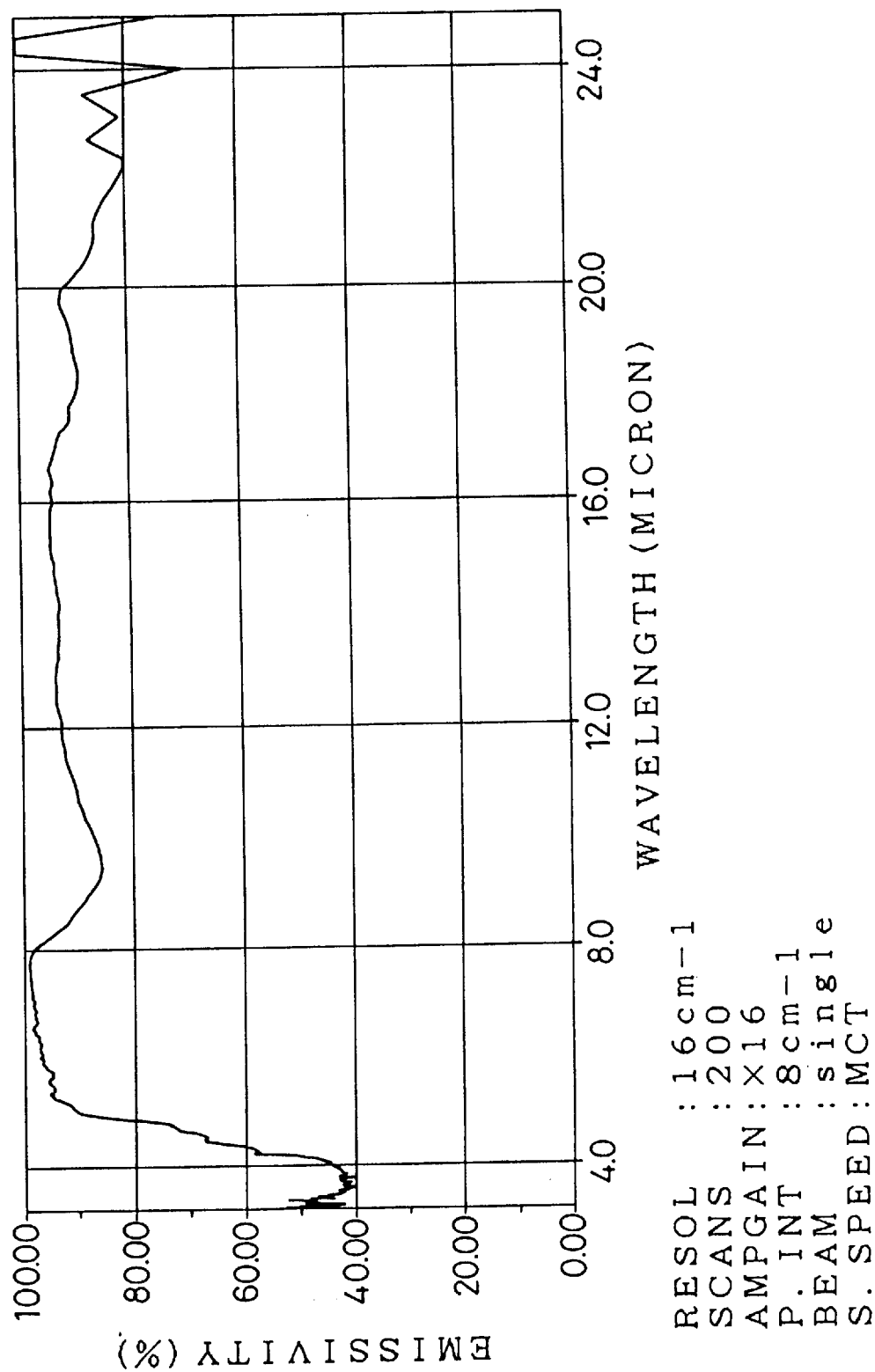
FIG. 10 is a graph indicating the characteristics of ceramic for use in the embodiment.

The ceramic plate 14 is mainly constituted of $SiO_2$ and $Al_2O_3$; and is, for example, composed of 70% by weight of $SiO_2$, 15% by weight of $Al_2O_3$, 3.7% by weight of $Fe_2O_3$, 3.2% by weight of $K_2O$, 3% by weight of $Na_2O$, 1.7% by weight of CaO, 1.64% by weight of MgO, 0.45% by weight of $TiO_2$, and the remaining percentage by weight of impurities. The emissivity characteristics of such a ceramic at a temperature of 141.1° C., as determined through experimentation, are shown in FIG. 10. As shown in FIG. 10, an emissivity of at least 80% is provided in the range of wavelengths exceeding about 5.0 μm.

A method of dip coating is used to coat the ceramic plate 14 with the resin layer 16. First, the ceramic plate 14 is soaked in and pulled upward from liquid resin, and heated or air-dried as required, such that the resin layer 16 is cured and securely formed on the ceramic plate 14. Alternatively, resin which is cured by ultraviolet radiation can be used.

In the electronic component 10 constructed as aforementioned, the heat generated by the semiconductor device 12 is transferred to the ceramic plate 14, which in turn converts the heat from the semiconductor device 12 into far-infrared rays. In this manner, the heat is radiated from the heat radiative plate 18 to the surrounding area. Therefore, heat is efficiently released from the semiconductor device 12, and a rise in temperature of the semiconductor device 12 can be controlled.

In the first embodiment, the ceramic plate 14 is completely surrounded and reinforced with the resin layer 16, and is thereby prevented from breaking. Therefore, no ceramic powder is scattered from the ceramic plate 14. Even if the plate 14 breaks or chips and generates ceramic powder, the powder is prevented from falling down on a substrate to which the semiconductor device 12 is mounted, because the ceramic plate 14 is entirely coated with the resin layer 16. Therefore, the circuit provided on the substrate is prevented from malfunctioning due to scattered ceramic powder.

Figure 3:
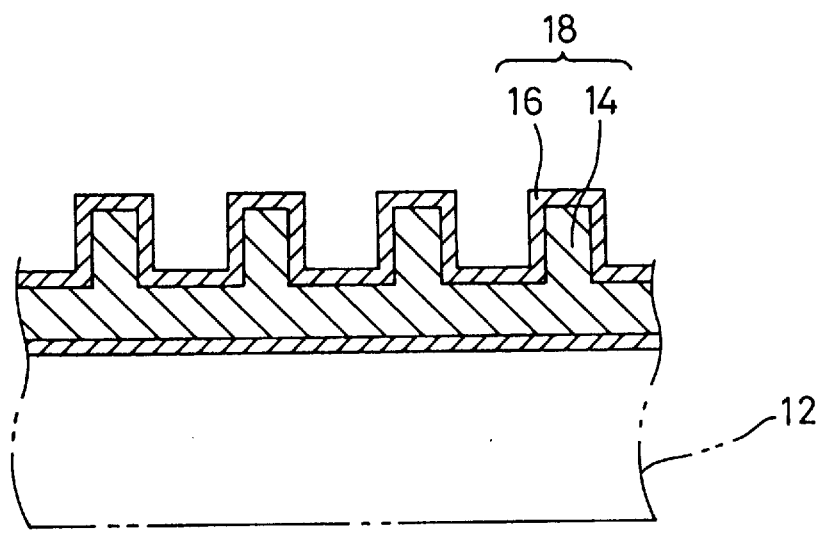
FIG. 3 is a cross-sectional view of part of a heat radiative plate of a second embodiment.

As shown in FIG. 3, when fins or raised portions 14 are provided on an upper surface of heat radiative plate 18 and resin layer 16, according to a second embodiment of the invention, the surface area of the plate 18 is enlarged, thereby advantageously enhancing heat radiation.

THIRD EMBODIMENT

Figure 4:
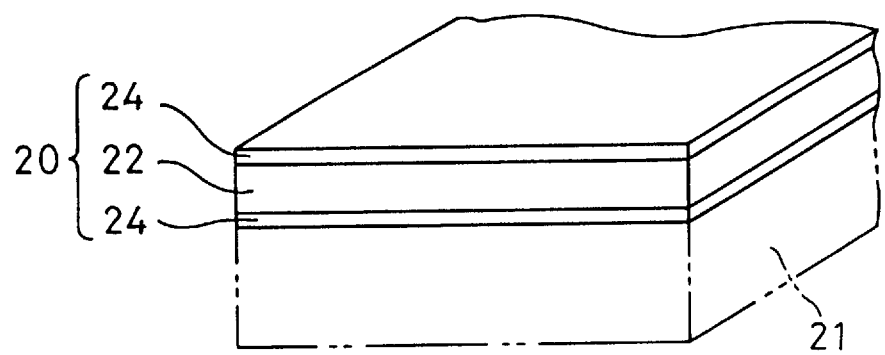
FIG. 4 is a perspective view of a heat radiative plate of a third embodiment.

As shown in FIG. 4, a heat radiative plate 20 provided with a ceramic plate 22 according to a third embodiment is mounted on a semiconductor device 21. Only the opposite surfaces of the plate 22 are coated with a resin layer 24. Since the ceramic plate 22 is reinforced with the resin layers 24, the plate 22 is prevented from cracking and/or chipping.

Figure 5:
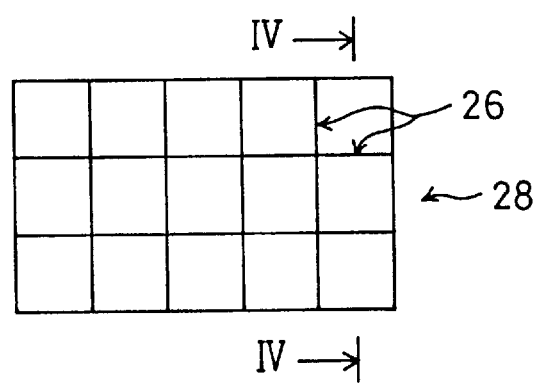
FIG. 5 is a plan view of a ceramic plate used for the manufacture of the heat radiative plate.
Figure 6:
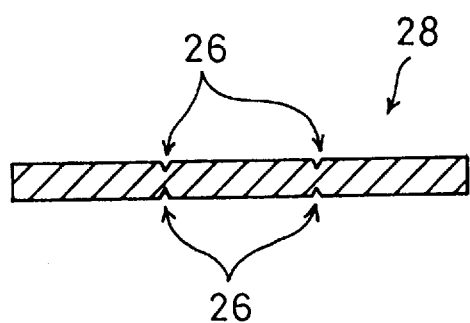
FIG. 6 is a cross-sectional view taken along line VI—VI in FIG. 5.

When the heat radiative plate 20 is manufactured as shown in FIGS. 5 and 6, a plurality of V-shaped notches 26 are made in a ceramic plate 28, such that the notches 26 form a lattice pattern on the plate 28. After the opposing surfaces of the ceramic plate 28 are entirely coated with resin, the plate 28 is cut along the notches 26 into a plurality of heat radiative plates 20. By such a method, a large number of heat radiative plates 20 can be cost effectively manufactured from a single ceramic plate 28.

FOURTH EMBODIMENT

Figure 7:
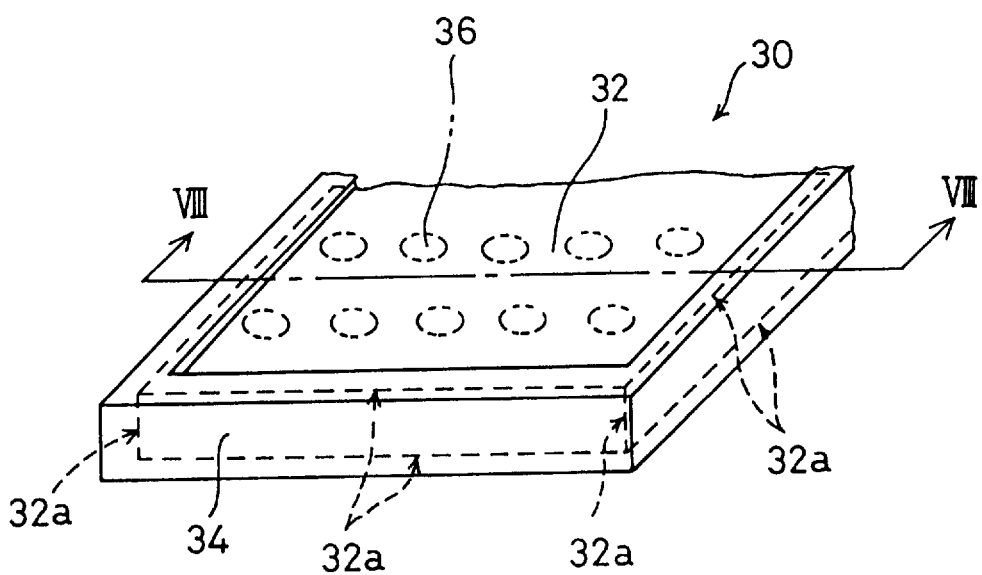
FIG. 7 is a perspective view of a heat radiative plate of a fourth embodiment.
Figure 8:
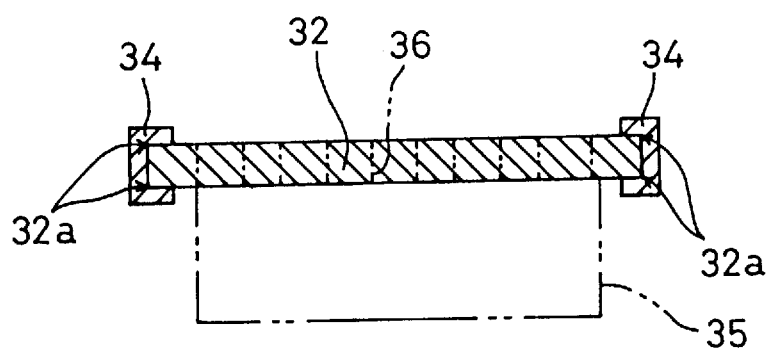
FIG. 8 is a cross-sectional view taken along VIII—VIII in FIG. 7.

As shown in FIGS. 7 and 8, a heat radiative plate 30 according to a fourth embodiment is provided with a ceramic plate 32 having edges 32a, which are easily broken portions, coated with a resin layer 34. The portions of opposing upper and lower surfaces of the ceramic plate 32, other than edges 32a, are left uncoated. As shown in FIG. 8, by bonding the uncoated portion of the lower surface of ceramic plate 32 directly to a semiconductor device 35, heat from the semiconductor device 35 is rapidly transmitted to the ceramic plate 32. In addition, since a large portion of the upper surface of ceramic plate 32 is uncoated, heat is not confined inside the ceramic plate 32 by the resin layer 34. Therefore, heat is efficiently released to the surrounding area. The edges 32a, which are coated with the resin layer 34, are prevented from breaking and scattering ceramic powder to the surrounding area. By making holes 36, shown with a dashed line, in the uncoated part of the ceramic plate 32, heat radiation can be further improved.

FIFTH EMBODIMENT

Figure 9:
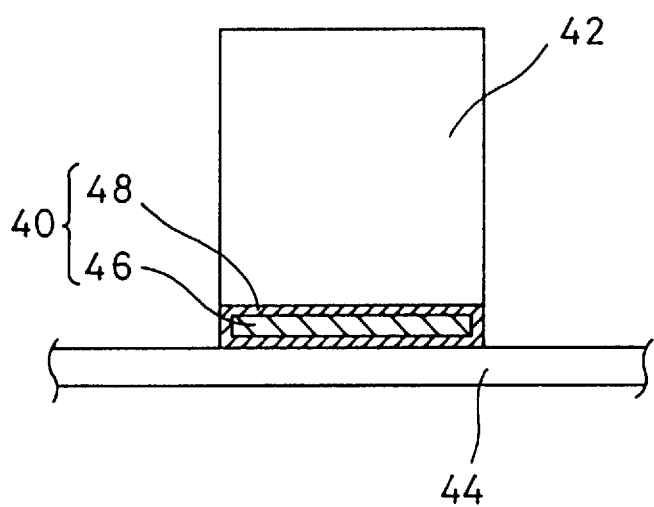
FIG. 9 is a cross-sectional view of a heat radiative electronic component of a fifth embodiment.

In the aforementioned embodiments, the heat radiative plates 18, 20, 30 are mounted on the semiconductor devices 12, 21, 35, respectively. In the fifth embodiment shown in FIG. 9, a radiative plate 40 is mounted between two electronic components; such as a transformer 42 and a base 44. In the same manner as in the first embodiment shown in FIGS. 1 and 2, the entire surface of a ceramic plate 46 is coated with a resin layer 48. As in the first embodiment, heat generated by the transformer 42 is conducted to the ceramic plate 46, and the plate 46 in turn converts the heat into far-infrared rays and radiates the heat to the surrounding area. A rise in temperature of the transformer 42 can thus be controlled. In addition, the ceramic plate 46 and the resin layer 48 electrically insulate the base 44 from the transformer 42.

This invention has been described above with reference to the preferred embodiments as shown in the figures. Modifications and alterations may become apparent to one skilled in the art upon reading and understanding the specification. Despite the use of the embodiment for illustration purposes, the invention is intended to include all such modifications and alterations within the spirit and scope of the appended claims. For example, the holes 36 described in the fourth embodiment may be used in place of the raised portions 14 to form irregularities on an upper surface of the heat radiative plate 18 of the second embodiment, or in any of the other embodiments.

What is claimed is:

1. An electronic component comprising an electronic device and a far-infrared radiative ceramic plate mounted on the electronic device for radiating heat generated by the electronic device as far-infrared radiation, wherein the improvement comprises:

an upper and lower surfaces of the ceramic plate, both of said upper and lower surfaces are coated with a resin layer located to resist breakage of the ceramic plate with an associated dispersion of ceramic particles; and side surfaces of the ceramic plate remain uncoated.

2. The electronic component according to claim 1, wherein the electronic device is a transformer mounted to a base and the ceramic plate is mounted between the transformer and the base.

3. The electronic component according to claim 1, wherein at least one of raised portions and holes are formed on the upper surface of the ceramic plate to increase the surface area of the upper surface of the plate and facilitating radiation of far-infrared rays.

4. The electronic component according to claim 1, wherein the ceramic plate is quadrangular and has a thickness of about 1–2 mm.

5. The electronic component according to claim 1, wherein the resin layer is at least about 20 μm thick.

6. The electronic component according to claim 1, wherein the ceramic plate has a sufficient emissivity of far-infrared rays at a temperature of about 110° C. and lower to prevent the electronic device from overheating.

7. The electronic component according to claim 6, wherein the ceramic plate has a sufficient emissivity of far-infrared rays at a temperature of about 100° C. and lower to prevent the electronic device from overheating.

8. The electronic component according to claim 1, wherein the ceramic plate has an emissivity of far-infrared rays of about 0.8 or higher.

9. The electronic component according to claim 1, wherein the ceramic plate has an emissivity of far-infrared rays of about 0.8 or higher in a range of wavelengths of about 5.0 $\mu$m and higher.

10. The electronic component according to claim 1, wherein the ceramic plate is formed of an infrared radiating ceramic selected from a group consisting of cordierite, β-spodumene, aluminum titanate and Bakuhanseki.

11. The electronic component according to claim 1, wherein the ceramic plate is formed mainly of $SiO_2$ and $AlO_3$.

12. The electronic component according to claim 11, wherein the ceramic plate is formed of about 70% by weight of $SiO_2$, about 15% by weight of $Al_2O_3$, about 3.7% by weight of $Fe_2O_3$, about 3.2% by weight of $K_2O$, about 3% by weight of $Na_2O$, about 1.7% by weight of CaO, about 1.64% by weight of MgO, about 0.45% by weight of $TiO_2$, and a remainder by weight of impurities.

13. An electronic component comprising an electronic device and a far-infrared radiative ceramic plate mounted on the electronic device for radiating heat generated by the electronic device as far-infrared radiation, wherein the improvement comprises:

both outer perimeter edges and side surfaces of the ceramic plate are coated with a resin layer located to resist breakage of the ceramic plate with an associated dispersion of ceramic particles; and both upper and lower surfaces of the plate remain uncoated except for said outer perimeter edges, and the uncoated lower surface being mounted directly to the electronic device.

14. The electronic component according to claim 3, wherein at least one of raised portions and holes are formed on the upper surface of the ceramic plate to increase the surface area of the upper surface of the plate and facilitating radiation of far-infrared rays.

15. An electronic component comprising an electronic device and a far-infrared radiative ceramic plate mounted on the electronic device for radiating heat generated by the electronic device as far-infrared radiation, wherein the improvement comprises:

both upper and lower surfaces of the ceramic plate are coated with a resin layer located to resist breakage of the ceramic plate with an associated dispersion of ceramic particles;

side surfaces of the ceramic plate remain uncoated; and the ceramic plate is formed of about 60% by weight of $MnO_2$, about 20% by weight of $Fe_2O_3$, about 10% by weight of CuO and about 10% by weight of CoO.

* * * * *